(12) United States Patent
Tran et al.

(10) Patent No.: US 7,142,477 B1
(45) Date of Patent: Nov. 28, 2006

(54) MEMORY INTERFACE SYSTEM AND METHOD FOR REDUCING CYCLE TIME OF SEQUENTIAL READ AND WRITE ACCESSES USING SEPARATE ADDRESS AND DATA BUSES

(75) Inventors: Thinh Tran, Palo Alto, CA (US); Joseph Tzou, Mountain View, CA (US); Suresh Parameswaran, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 195 days.

(21) Appl. No.: 10/871,825

(22) Filed: Jun. 18, 2004

(51) Int. Cl.
*G11C 8/00* (2006.01)

(52) U.S. Cl. .......................... 365/230.02; 365/230.08; 365/230.01

(58) Field of Classification Search ........... 365/230.02, 365/230.08, 230.01
See application file for complete search history.

(56) References Cited

U.S. PATENT DOCUMENTS

| | | | |
|---|---|---|---|
| 6,026,050 A * | 2/2000 | Baker et al. ................. | 365/233 |
| 2002/0023200 A1* | 2/2002 | Ryan et al. .................. | 711/167 |
| 2002/0054532 A1* | 5/2002 | Ooishi et al. ............... | 365/226 |

OTHER PUBLICATIONS

"General DDR SDRAM Functionality," © 2001 Micron Technology, Inc., pp. 1-11.

* cited by examiner

*Primary Examiner*—Richard Elms
*Assistant Examiner*—N Nguyen
(74) *Attorney, Agent, or Firm*—Kevin L. Daffer; Daffer McDaniel, LLP

(57) ABSTRACT

A memory interface system and method are provided for transferring data between a memory controller and an array of storage elements. The storage elements are preferably SRAM elements, and the memory interface is preferably one having separate address bus paths and separate data bus paths. One address bus path is reserved for receiving read addresses and the other address bus path is reserved for receiving write addresses. One of the data bus paths is reserved for receiving read data from the array, and the other data bus path is reserved for receiving data written to the array. While bifurcating the address and data bus paths within the interface is transparent to the memory controller, the separate paths afford addressing phases of a read and write address operation to be partially overlapped, as well as the data transfer phases. This will essentially reduce the cycle time between a read and write memory access, and proves useful when maximizing the data throughput across the data bus when implementing double data rate (QDR) mechanisms.

15 Claims, 6 Drawing Sheets

MEMORY INTERFACE SYSTEM AND METHOD FOR REDUCING CYCLE TIME OF SEQUENTIAL READ AND WRITE ACCESSES USING SEPARATE ADDRESS AND DATA BUSES

BACKGROUND OF THE INVENTION

1. Field of the Invention

This invention relates to semiconductor memory and, more particularly, to a memory interface that transparently separates the read and write address and data buses to achieve a faster sequential read and write cycle time.

2. Description of the Related Art

The following descriptions and examples are not admitted to be prior art or conventional by virtue of their inclusion within this section.

Most computing systems consist of four functional blocks: a microprocessor (or CPU), memory, input/output (I/O) interface, and an I/O device. The CPU is interconnected to the memory and the I/O interface via an address bus and a data bus. The address bus provides a path in which the CPU can select certain storage locations in which data is stored. The data bus provides a path over which data is transferred between the CPU, memory, and the I/O interface. Most microprocessors handle bits in 16, 32, or 64 bit groups. Thus, the address bus and data bus are normally 16, 32, or 64 bits wide.

The mechanism by which a CPU or I/O interface accesses memory depends on the type of memory being accessed. There are numerous types of memories available in the marketplace. For example, data can be stored in magnetic memory, such as a hard disk drive, or stored in memory elements upon an integrated circuit, sometimes referred to as "semiconductor memory." Semiconductor memory is typically arranged closer to the CPU or execution unit than a hard disk drive and, therefore, can be accessed much faster than magnetic memory.

Common to semiconductor memory is an array of storage elements. Depending on the type of semiconductor memory, each storage element can have a significantly different architecture and function. For example, a storage element can be volatile or non-volatile. Types of volatile memory include memory that must be periodically refreshed (DRAMs) or memory that will lose its programmed state if power is removed (SRAMs).

The differences between SRAMs and DRAMs are fairly significant. Each storage element of SRAM includes latch and pass transistors. Conversely, each cell of DRAM involves simply one transistor and a capacitive storage element. While DRAMs are significantly denser than SRAMs, DRAMs require additional support circuitry to coordinate the accesses of each element, along with the need to periodically refresh that element.

SRAMs typically implement complementary bit lines and bit line signals and enjoy the benefits of faster access times than DRAMs. SRAMs are oftentimes used as the primary cache of the CPU, whereas DRAMs are generally used as the main semiconductor memory. SRAM has a faster access time than DRAM since performance of a read operation simply involves asserting an address, asserting a chip select line, and a read/write enable signal. The requested data will then appear sometime thereafter upon the data lines.

As used herein, the term "access time" for a read operation, for example, is the time between when an address is placed on the address bus and the addressed data appears on the data bus. Access time often gauges the speed of the memory, which is the time from assertion of a valid address to valid data (read operation), or to completion of the write into the array (write operation).

Even with fast access time associated with SRAM, one memory access cannot be rapidly followed by another memory access. The time from one memory access to the next is often referred to as the "cycle time." For SRAM, cycle time is generally equal to the access time. Therefore, in an SRAM, a write operation must wait until the read operation has completed before the write operation can begin. This is due primarily to the address bus and data bus needing to be free of the previous operation before new addresses and data are presented on those respective buses. The problem of having a cycle time constraint on conventional SRAM is made more profound with the advent of newer double data rate (DDR) SRAM.

DDR memory allows data to be captured at a rate of twice the frequency of the clock signal sent along the control bus. This is accomplished by utilizing a 2n prefetch architecture, where the internal data bus of the DDR memory is twice the "n" width of the external data bus to allow data capture of twice per system clock cycle. A special form of DDR, when implementing both read and write accesses during the same cycle is referred to as quad data rate (QDR) SRAM. Under QDR transfer mechanisms, the internal data bus allows external data to be captured at four times per system clock cycle. Details of the difference between single data rate (SDR) and DDR, and the ramifications for QDR memories can be found in "General DDR SDRAM Functionality," Micron Technology, 2001 (herein incorporated by reference).

While both SDR and QDR memory devices generally include the same array of storage elements, the input/output memory interface is considerably different. For example, QDR utilizes a differential pair of system clock signals to formulate the triggering rising and falling clock edges, and data strobe signals are needed to drive the data signal to and from the QDR-accessed memory banks. The differential system clock signals and the data strobe signals can allow accesses to occur and data to be strobed every one-half cycle of the system clock. Data throughput can, therefore, be substantially increased at a 2× factor.

While it would be beneficial to implement QDR SRAM with faster access time than DRAM, it would also be beneficial to reduce the cycle time between accesses. A desired solution should be one that can implement QDR SRAM accesses, but with subsequent accesses occurring partially concurrent with the previous accesses in order to reduce the cycle time, and therefore take full advantage of a high-speed system clock implemented in a QDR methodology.

SUMMARY OF THE INVENTION

The problems outlined above are solved by an improved semiconductor memory and, more specifically, a QDR SRAM that can output data in multiples of each every clock cycle of the system clock. The system clock, synchronous with the data strobe, is sent with the control bus between the functional elements of the CPU, memory, and I/O interface. By transferring data to and from the memory each one-half clock cycle of the system clock, data throughput across the data bus is substantially increased. To take full advantage of this increased throughput, however, cycle times of a read operation, followed by a write operation (i.e., read access followed by a write access) is reduced. The reduced cycle time is preferably achieved using separate address and data buses internal to a memory interface of the SRAM. While the memory and data buses are bifurcated within the memory interface, the data and address buses are not bifurcated outside of the memory interface and, specifically, are not bifurcated between the interface-fitted memory and a CPU or I/O interface. Therefore, outside of the memory interface, neither the address bus nor the data bus appear as bifurcated and, in fact, are not bifurcated. Only internal to the interface, and transparent to a user and system designer, is the address bus and data bus bifurcated.

Bifurcation of the address and data buses are achieved by forming two paths in the interface. A first path of the address bus can receive a read address, and a second path can receive a write address. The write address can be stored in one or more registers along the second path. While the read address can be multiplexed into the array first, the write address is nonetheless prefetched and stored at or near the input of the multiplexer in readiness for the subsequent write operation. The output of the multiplexer is connected directly into the array and, therefore, all prefetching involved with decoding and making the address available has previously taken place, so that the write address can be immediately presented to the array once the data is read from the array during the previous read operation. Separating the read and write address paths into a bifurcated address bus allows faster addressing and, specifically, overlapping a portion of the write address with the read address to lower the cycle time.

In addition to the bifurcation of the address bus, the data bus is also bifurcated internal to the memory interface. As data is being read from the array using sense amplifiers, the data can be stored in buffers within a read data path, while write data is sent to the array across a write data path. The data to be written to the array can occur across the write data path partially and contemporaneous with data being read from the array across the read data path. Similar to the read address and write address paths, the read data and write data paths allow concurrent movement of data and partial overlap of the read and write operations to lower the memory cycle time. The data paths are separated because the address paths are separated and, therefore, partially concurrent read/write addressing follows hand-in-hand with partially concurrent read and write data.

According to one embodiment, a memory interface system is provided. The memory interface includes a first latch coupled to receive a read address and write address. The first path and the second path are coupled to an output of the latch for receiving the read address and the write address along those respective paths. A storage device, such as a register, is coupled to the second path. A multiplexer having a first input and a second input is coupled to the respective first and second paths for sending the read address into the array before sending the write address. The array is preferably an SRAM device, and preferably the first and second paths each comprise a predecoder and a buffer. The write address is sent through the predecoder and the buffer upon the second path from the storage device, and held within a second latch whose output is directly coupled to the second input upon the first input of the multiplexer receiving the read address. The first input and the second input of the multiplexer are preferably coupled to receive the write address before a read enable signal is received upon a select pin of the multiplexer.

In addition to the memory interface system for addressing an array of storage elements, the memory interface system also includes a system for sending read data from and write data to the array of storage elements. The system which sends read data from and write data to the array includes a first data path and a second data path. The first path includes a sense amplifier and a buffer. The sense amplifier is coupled to sense read data from the array and the buffer is coupled to the sense amplifier for storing the read data. The second path includes a storage device and a write driver. The storage device is coupled to store write data sent to the array contemporaneous with the sense amplifier coupled to sense read data. The write driver is further coupled to drive the stored write data contemporaneous with the output buffer storing the read data.

According to yet another embodiment, a method is provided for accessing (i.e., addressing, reading, and writing data) an array of storage elements. The method includes storing upon an input to a multiplexer a write address sent over a write address path. Upon another input of the multiplexer, a read address is sent over a read address path in parallel with the write address path. Then, read data is sensed from the array of storage elements sent across a read data path. While sensing the read data, write data is sent across a write data path to be written to the array at the write address.

BRIEF DESCRIPTION OF THE DRAWINGS

Other objects and advantages of the invention will become apparent upon reading the following detailed description and upon reference to the accompanying drawings in which.

Figure 1:
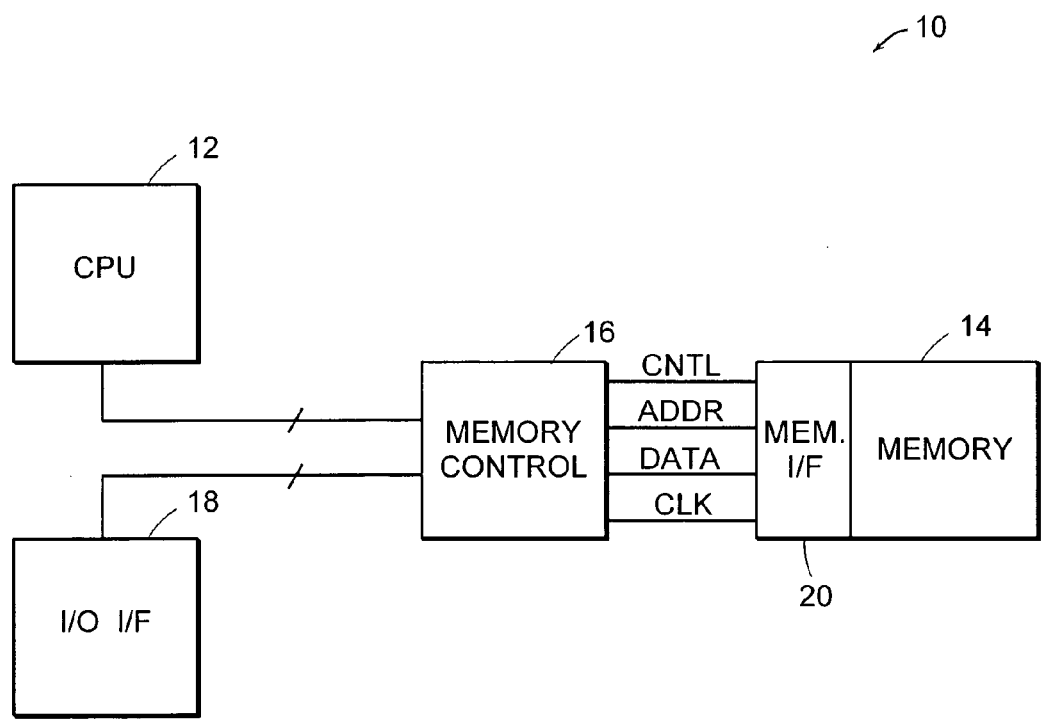
FIG. 1 is a block diagram of an execution engine, memory controller, memory, and memory interface that receives address, control, data and clock signals from the memory controller and bifurcates the address and data buses internal to the interface into separate read and write address and data paths into and from the memory for faster cycle time from one memory access to the next.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Turning now to the drawings, FIG. 1 illustrates various functional blocks of a computing system 10. System 10 includes a microprocessor or CPU 12. CPU 12 is oftentimes referred to as an execution engine or processor. Most CPUs are known to incorporate two operational units: an integer unit and a floating-point unit. These units communicate data via a data cache and are controlled by a single instruction stream supplied by an instruction cache. The data cache and instruction cache can be connected to memory 14 if desired by a memory controller 16. The instruction cache can supply multiple instructions per fetch if, for example, CPU 12 is a superscalar processor. The actual number of instructions fetched can vary. As the instructions are dispatched from the instruction cache, a decoder will decode those instructions and place them into a prefetch unit, and finally into the execution engine. Any out-of-order conditions can be resolved by a reorder buffer, which places those instructions back into a register file and, thereafter, into the prefetch unit for re-execution. The general implementations of superscalar architecture RISC and CISC instruction sets, as well as integer and floating-point units, prefetch unit, and reorder buffers are generally known to those skilled in microprocessor architecture.

Communication between CPU 12, I/O interface 18, and memory controller 16 occur across a local bus or, possibly, a mezzanine or peripheral bus such as a PCI bus associated with I/O interface 18. The bus architecture generally involves a control bus, a data bus, and an address bus of varying widths. The functional units are typically synchronized to a master clock, oftentimes referred to as a system clock sent along the control bus. The memory controller can either by synchronized to the system clock on the control bus or synchronized to its own controller clock. Synchronizing the controller clock and the system clock at the same frequency will cause synchronous accesses to the memory and, to take advantage of the synchronous accesses, synchronous memory systems are employed. Popular synchronous memory includes SDRAM and, specifically, SRAM.

Figure 4:
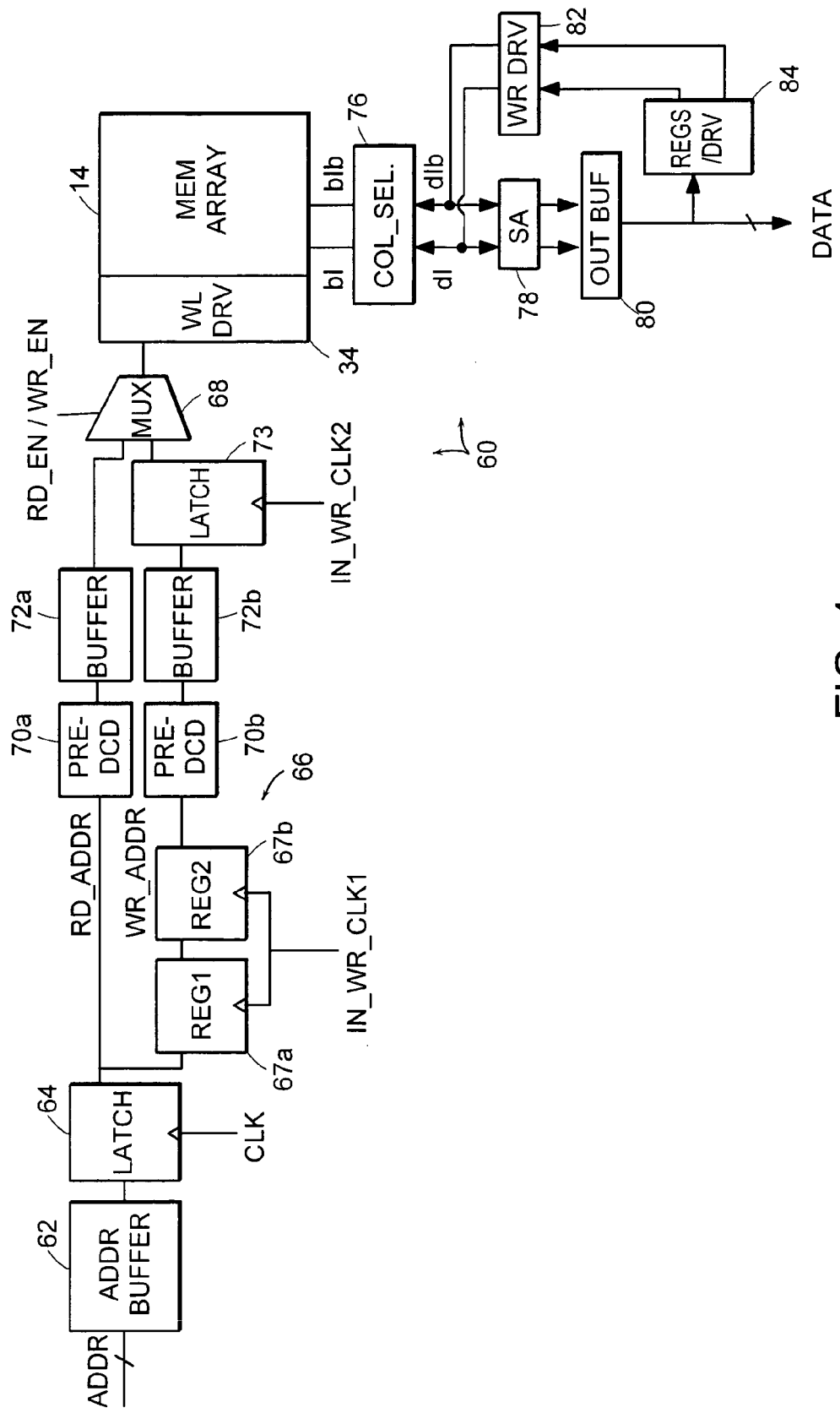
FIG. 4 is a block diagram of the memory interface, according to a preferred embodiment, coupled to a memory array.
Figure 5:
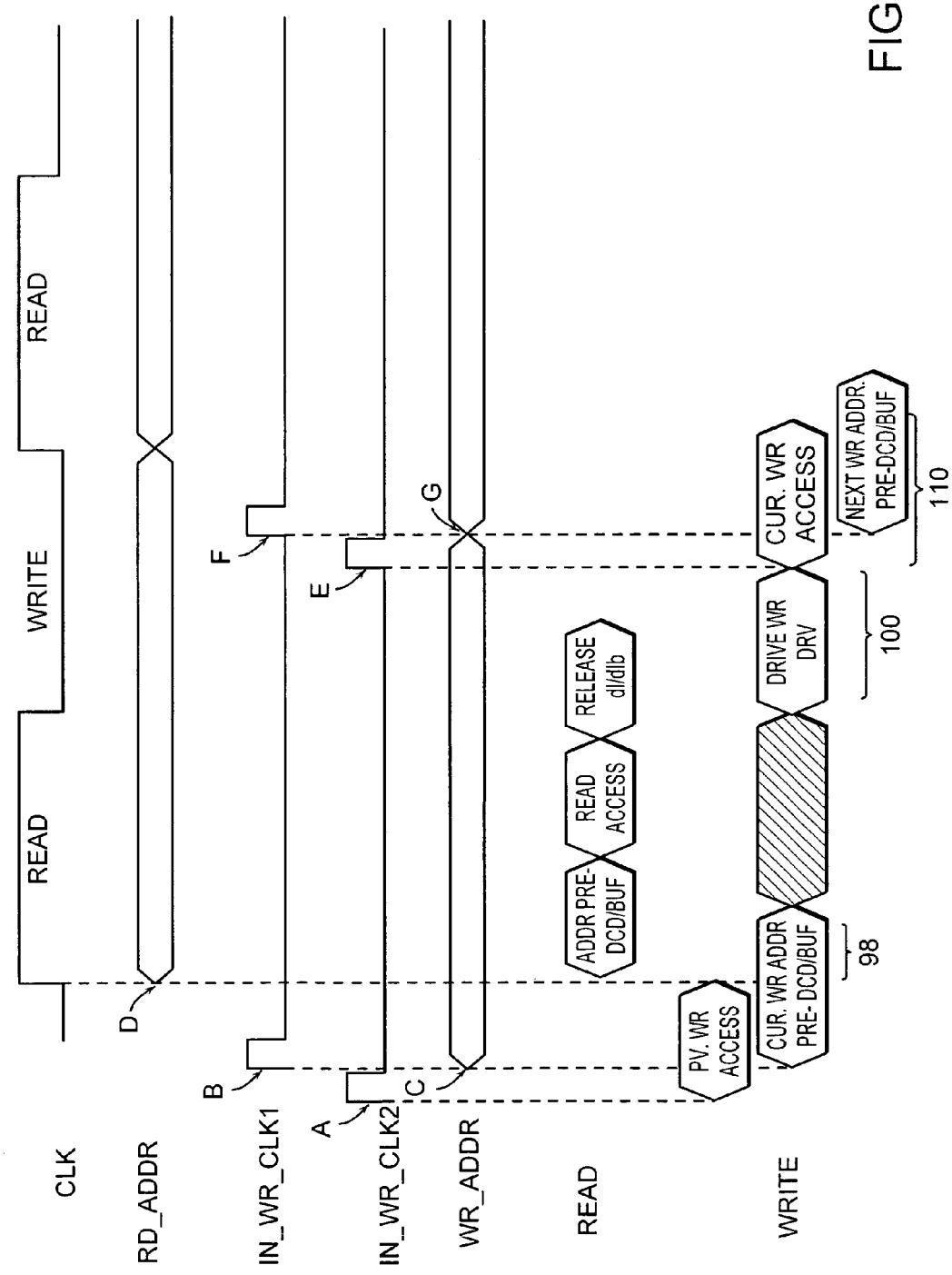
FIG. 5 is a timing diagram of signals at various nodes of the memory interface of FIG. 4.

Memory controller 16 is shown connected to a memory interface 20 hereof. Memory controller 16 sends the conventional control, address, data, and system clock signals into memory interface 20 and, therefore, it is transparent to the user what memory interface 20 does to those signals by bifurcating the control and address signals as will be described herein below. The clock signal (CLK) can be used to form a data strobe, and can be formed into a complementary pair of clock signals from which a QDR operation can ensue. If so, if the system clock (CLK) transitions at, for example, 150 MHz, then the data transfer rate across the data bus might be 300 MHz if memory 14 is synchronous to CLK. Details of memory interface 20 operation and architecture are described in two embodiments, beginning with FIGS. 2 and 3, followed by FIGS. 4 and 5. The preferred embodiment is shown in FIGS. 4 and 5, however.

Figure 2:
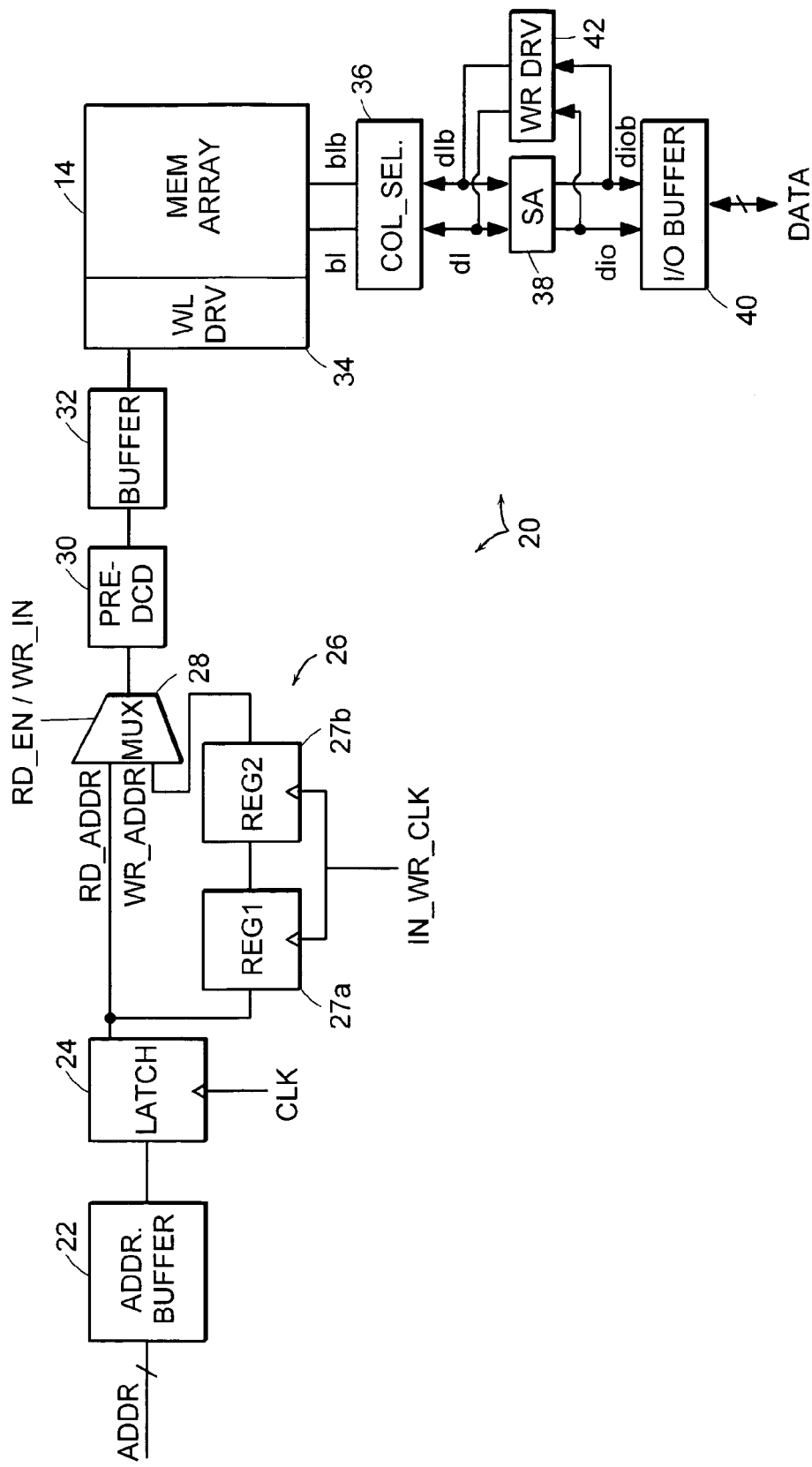
FIG. 2 is a block diagram of the memory interface, according to one embodiment, coupled to a memory array.
Figure 3:
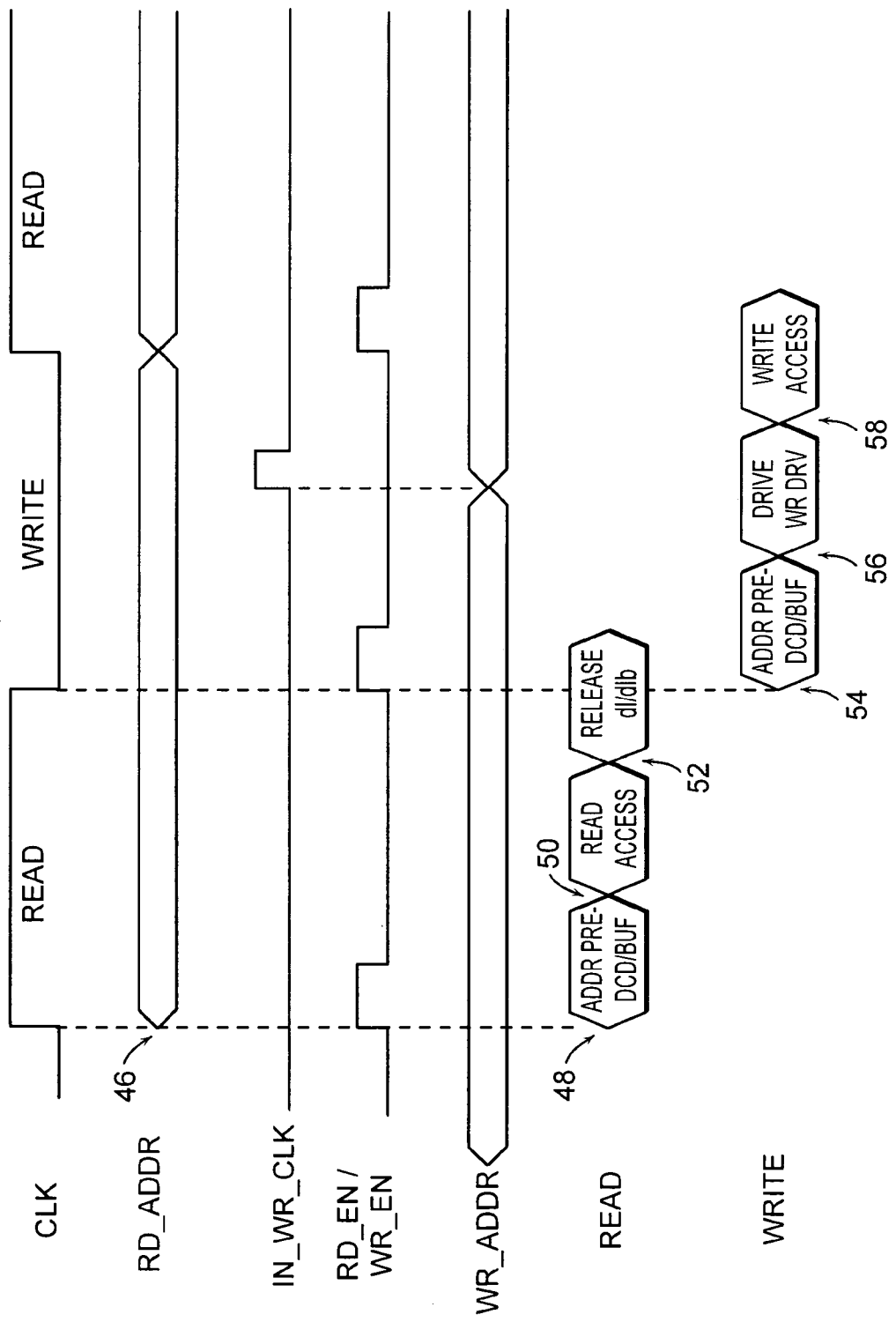
FIG. 3 is a timing diagram of signals at various nodes of the memory interface of FIG. 2.

Turning now to FIGS. 2 and 3 in conjunction, FIG. 2 illustrates a memory interface 20 connected to memory 14. Memory interface 20 includes a buffer 22 connected to receive addresses sent across the address bus. Buffer 22 is essentially a circuit that does not alter the logic values of the address bits going through it, yet provides isolation of those values at the output of buffer 22. If the address bus constitutes 16 bit values, for example, then buffer 22 will retain those values and place the same logic values received upon its output to latch 24.

Latch 24 involves either one omnibus latch or a plurality of latches coupled to receive the buffered address bits which are sampled, for example, on the rising edges of the system clock. If QDR is employed, then the address bus is sampled on both the rising and falling edges of the system clock. Latch 24 is preferably a gated latch and, more specifically, involves a transparent mode of operation. When enabled, the outputs from latch 24 will follow the inputs, and the output will hold the last value placed into the input when disabled. The inputs are gated by the clock signal (CLK). For example, beginning at the rising edge of the clock signal, the read address bit values on the address bus are sampled and passed onto latch 24 output, and during after the falling edge of the clock signal, those outputs are held in conformance with the transparent mode. However, beginning with the falling edge of the clock signal, write addresses are sampled and thereafter held after the rising edge of the clock signal.

Output from latch 24 is thereby channeled based on the phase of the clocking signal to either a read address path or a write address path. Within the write address path is a storage device 26. Preferably, the storage device includes one or more registers that sample and hold write address bit values on the rising edges of an internal clock, referred to as IN_WR_CLK. More than one register may be needed depending on the depth of the write pipeline. In the example of FIG. 2, two registers 27a and 27b are provided.

The bit values sent over the read and write address paths are held on the input of multiplexer 28 or within storage device 26 (subsequently held at the input of multiplexer 28). The impedance to multiplexer 28 prevents substantial loss of voltage values so that whatever set of address bits are placed on those inputs, the values will remain for at least one cycle of the clocking signal.

A read enable (RD_EN) and a write enable (WR_EN) signal synchronized to the rising and falling edges of the clocking signal determine whether the read address bit values or the write address bit values are forwarded to a predecoder 30, buffer 32, and finally to the word-line drivers 34 of memory array 14. Thus, connected to the select input of multiplexer 28 is the read enable and write enable signal. Decoder 30 essentially functions to convert, for example, a binary coded decimal (BCD) input of 2n states to an n decimal value. The n values then feed directly to each word line of driver 34 after those values have been appropriately buffered and voltaged by buffer 32.

Whatever read or write address is placed into the word-line drivers 34, is also placed into a column select circuit 36. Although not shown for brevity and clarity in the drawing, the column select circuitry 36 responds to the incoming address, similar to driver 34, by selecting a particular pair of bit lines (bl and blb). The pair of bit lines are oftentimes referred to as complementary bit lines, with bl representing the true voltage value and blb representing the inverted voltage value. In this fashion, the address signals can address the particular storage element within array 14. Column select circuit 36 is shown placed within a data path by which incoming date (during a write operation) or outgoing data (during a read operation) traverse.

Outgoing data can be sensed by sense amplifier 38. Sense amplifier 38 essentially compares the differential voltage values on the complementary bit lines or data lines (dl and dlb). The sensed voltage difference can then be output on the complementary data input/output lines (dio and diob) onto input/output buffer 40. If, instead of a read operation, a write operation forces data to be written to array 14 that is originally sent into buffer 40, and then driven onto the column select circuit 36 via a write driver circuit 42. The operation of the read/write addressing and read/write data paths of interface 20 in FIG. 2 is further illustrated in FIG. 3.

FIG. 3 is a timing diagram of read and write operations and, specifically, shows a read operation followed by a write operation, both of which occur during a single clock cycle of the system clock. When the system clock transitions to a logic high voltage value, a read address (RD_ADDR) will appear at the time 46. Synchronized to the rising and falling edges of the clock is a read enable and write enable signal. The read enable and write enable signals can be formed using, for example, a one-shot circuit having an a-stable state maintained by the specification of the one-shot. Thus, at time 48, the read address on the input of the multiplexer 28 (FIG. 2) will be sent into the predecoder 30, buffer 32 (FIG. 2), and then at time 50, a read access will occur by the word-line drivers driving the appropriate word lines onto memory array 14 (FIG. 2). The data addressed by the read address will then emanate from array 14 and be sensed by the sense amplifier 38, and thereafter placed on the input/output buffer 40 (FIG. 2). This will cause the sense amplifier to release the complementary data lines at time 52. Once the complementary data lines are released, then a write operation can occur, beginning with a write address pre-existing upon the storage device 26.

Comparing FIGS. 2 and 3, the write address would normally occur upon a falling edge of the system clock, however, since the register is essentially buffer or delay the write address, the write address does not appear until sometime thereafter. Thus, even though the write address exists at the input of multiplexer 28, it is not until the write enable signal is activated during the falling edge of the clock signal that the write address will be sent into the predecoder 30 and buffer 32, as shown by reference numeral 54. Thereafter, reference numeral 56 indicates data being driven onto the corresponding bit lines via the write driver 42 and column select circuit 36. Thereafter, the properly activated word line drivers 34 will allow a write access into the array 14, as noted by reference numeral 58.

FIGS. 2 and 3 illustrate bifurcation of the read and write address paths, as well as bifurcation of the read and write data paths. However, the time delay through predecoder 30 and buffer 32, prohibits effective overlap of certain operations within the write cycle with those of the read cycle. Thus, the write access cannot begin until the read access has completed. To do otherwise would involve contention within the shared address line through predecoder 30, buffer 32, and I/O buffer 40. Thus, the cycle time from the read access operation to the write access operation is somewhat long since various portions of those operations cannot be overlapped. Therefore, a more preferred interface circuit with shorter cycle time is desired. The preferred interface circuit and timing diagram are illustrated in FIGS. 4 and 5.

Referring to FIGS. 4 and 5 in conjunction, an alternative and preferred embodiment for a memory interface 60 is illustrated having address buffer 62, latch 64, storage device 66, with one or more registers 67a/b, similar to items 22–27b (FIG. 2). However, instead of placing multiplexer 68 in the read and write address paths prior to the predecoder (as in FIG. 2), multiplexer 68 is placed post the predecoder and buffer circuits. Also, a predecoder 70a/b and buffer 72a/b are provided on each of the bifurcated paths. Items 62–72 operate identical to items 22–32 of FIG. 2. In addition, a second latch 73 is provided in the embodiment of FIG. 4.

Latch 73 is also a transparent latch, similar to latch 64 in FIG. 2. However, instead of being clocked by the system clock, latch 73 is clocked by another internally generated clock (IN_WR_CLK2), similar to IN_WR_CLK (FIG. 3) or IN_WR_CLK1 (FIG. 4). IN_WR_CLK2 is generated from a one-shot that is synchronized and delayed relative to a rising or falling edge of the system clock. The second internal clock (i.e., IN_WR_CLK2) is preferably advanced in time relative to the first internal clock (i.e., IN_WR_CLK1), so that the first internal clock will present the write addresses in sequence to the predecoder 70b and, thereafter, the second internal clock will latch those sequential write addresses onto multiplexer 68. In this fashion, the write address pipeline is not disturbed.

In addition to the more elongated read and write address paths, a more elongated read and write data paths are provided. Similar to column select circuit 36, sense amplifier 38, and write driver 42 of circuit 20, circuit 60 illustrates identical function and structure for column select circuit 76, sense amplifier 78, and write driver 82. However, instead of the input/output buffer 40 being bidirectional, a substitute output-only buffer 80 is provided in the read data path. In the separate write data path in which write driver 82 is provided, registers and another buffer 84 are provided. In this fashion, read data can be stored in the output buffer 80, while write data is written into the column select circuit 76 via the write data bus, on which write driver 82 and registers 84 are coupled. This allows the read data to traverse the read data path while the write data traverses the write data path at the same time as the read data.

Circuit 60 allows the read address information to be stored and placed closer to the memory array 14 in readiness for a write enable signal than circuit 20. This ensures that the write address information is placed through the time-delayed buffer 72b as the read address traverses the read address path. Therefore, portions of the read and write address operations can overlap one another. Moreover, circuit 60 allows the read data to be output and stored along the read data path at the same time as write data is initiated onto the column select circuit. Again, circuit 60 allows overlap of data read and write operations. FIG. 5 illustrates in more detail that overlap functionality and the advantages thereof.

Figure 6:
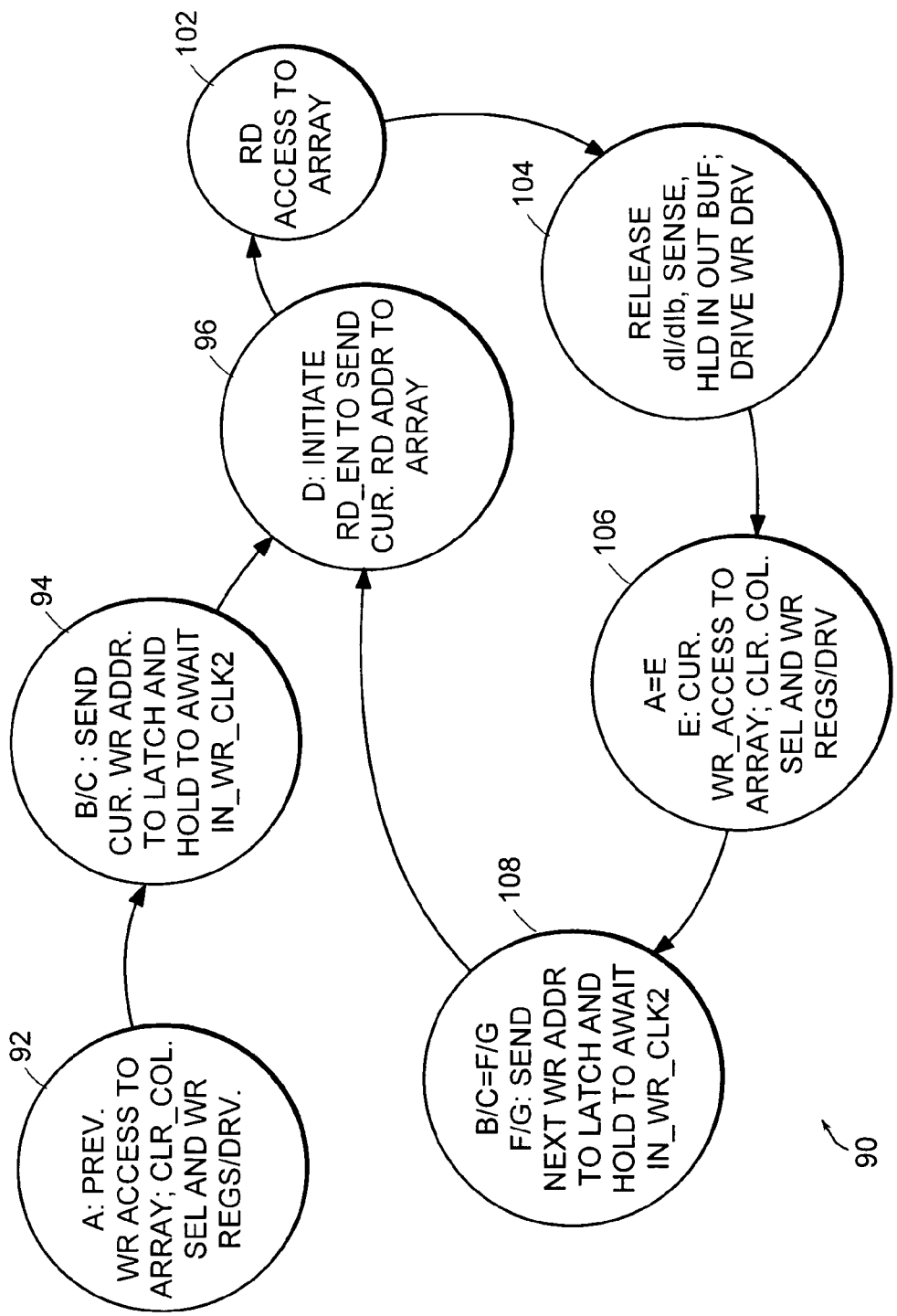
FIG. 6 is a state diagram of sequential states shown in the timing diagram of FIG. 5.

FIG. 5 is best illustrated in reference to the state diagram of FIG. 6. State diagram 90 includes certain states A–G corresponding to the states of FIG. 5. Referring to FIGS. 5 and 6 in conjunction, during a previous write operation in which the clocking signal is at a logic low voltage value, and the second internal clock transitions high, whatever was present within latch 73 is selected as a write address placed into the memory array. This represents a previous write access occurring at state A (see reference 92 in FIG. 6). Whatever data values that are driven from the write driver 82 will then be placed into the memory array 14 during the previous write access. Those data values are thereafter cleared, as well as the column select circuitry 76 and the register driver values on buffer 84.

At state B (see reference 94 in FIG. 6), the first internal clock signal is transitioned to a logic high voltage value causing the current write address to be stored within storage device 66. The stored write address values will then be placed as a write address at state C onto the predecoder 70b, buffer 72b, and the input of latch 73. Thus, the write operation indicates the current write address is sent to the predecoder and buffer, beginning at state B/C. Even before the write address is placed upon latch 73, a read address can be initiated by the rising edge of the system clock at state D (see reference 96 in FIG. 6). Thus, an overlap 98 occurs between the read and write addressing operations due to the separate read and write address bus paths.

Once state D has begun, then whatever is sent along the read address path is forwarded to the word-line driver 34 to begin the read access of memory array 14. Data read from array 14 will be sensed by sense amplifier 78 and placed on output buffer 80 as the complementary data lines (dl/dlb) are released from their voltage values. This will allow the next step in the write operation to occur by driving the write driver 82 within the separate write data bus path from the read data bus path on which output buffer 80 exists. This overlap 100 is made possible due to the separate read and write data bus paths. The read access and release of the complementary data lines, sense amplifier, and maintaining the read data in the output buffer, while driving the write driver 82 are shown by states 102 and 104 (FIG. 6). Noticeably, state 104 indicates overlap 100 in the separate read and write data paths.

Next, at state E, it is recognized that the read operation has completed and essentially the write address exists at the input of multiplexer 68, while the write data exists at the input of the column select circuit 76. Thus, when state E occurs by asserting the second internal clock at the input of multiplexer 68, knowing that write enable has been previously asserted at the beginning of the write cycle, the write address will be sent to the memory array to initiate a write access for the current write address. Thus, the write enable signal occurs previous to the second internal clock transitioning, to allow immediate write access once that second internal clock transitions to a high logic value. State E is shown as reference 106 in FIG. 6 and is equivalent to state A, with the then-existing write access occurring to the array, with the column select circuit reset, along with the write drivers and registers/buffers 82 and 84.

Thereafter, at state F, the next write address is clocked into storage device 66 to initiate the write address at the output of storage device 66. States F and G are similar to states B and C, which sends the next write address to the latch and holds within the latch to await the second internal clock transition, as shown by state 108 (FIG. 6). Thus, states 106 and 108 are equivalent to states 92 and 94, but for a subsequent write cycle occurring. Overlap 110 is made possible due to the second latch 73 holding the write address that has been pre-decoded and buffered at the input of multiplexer 68.

Numerous variations and modifications will become apparent to those skilled in the art once the above disclosure is fully appreciated. It is intended that the following claims are to be interpreted to embrace all such variations and modifications. In addition, the foregoing description is illustrative of only exemplary embodiments. The disclosure is not to be interpreted as reflecting an intention that the claimed invention requires more features than are expressly recited in each claim. The specification and drawings are to be regarded in an illustrative rather than a restrictive sense.

What is claimed is:

1. A memory interface system for addressing an array of storage elements, comprising:
   a first latch coupled to receive a read address and a write address;
   a first path and a second path coupled to an output of the latch for receiving respective said read address and said write address;
   a storage device coupled to the second path; and
   a multiplexer having a first input coupled to the first path and a second input coupled to the second path for sending the read address into the array before sending the write address stored by the storage device into the array.

2. The system as recited in claim 1, wherein the first and second paths receive respective said read address and said write address during successive portions of a clock cycle.

3. The system as recited in claim 1, wherein the array of storage elements are coupled to a plurality of word line driver inputs.

4. The system as recited in claim 3, wherein the multiplexer comprises a plurality of output conductors directly coupled to the plurality of word line driver inputs for receiving the read address before receiving the write address.

5. The system as recited in claim 1, wherein the first and second paths each comprises a pre-decoder and a buffer, and wherein the write address is sent through the pre-decoder and the buffer upon the second path from the storage device and held within a second latch whose output is directly coupled to the second input upon the first input receiving the read address.

6. The system as recited in claim 1, wherein the first input and the second input are coupled to receive the write address before a read enable signal is received upon a select pin of the multiplexer.

7. The system as recited in claim 1, wherein the storage device comprises a set of registers.

8. A method for accessing an array of storage elements, comprising:
   storing upon an input to a multiplexer a write address sent over a write address path;
   sending upon another input to the multiplexer a read address sent over a read address path in parallel with the write address path;
   sensing read data from the array of storage elements sent across a read data path read data accessed by the read address; and
   while sensing read data, sending write data across a write data path to be written to the array at the write address.

9. The method as recited in claim 8, wherein said storing comprises holding the write address held within a set of registers.

10. The method as recited in claim 8, further comprising forwarding the read address from the multiplexer before forwarding the write address.

11. The method as recited in claim 8, further comprising forwarding the read address from the multiplexer while storing upon an input to the multiplexer the write address.

12. The method as recited in claim 8, wherein said sensing comprises storing the sensed read data in an output buffer while sending the write data across the write data path.

13. The method as recited in claim 8, further comprising storing the write data into a set of registers coupled to the write data path while storing the sensed read data in an output buffer coupled to the read data path.

14. The method as recited in claim 8, further comprising selecting complementary bit lines for sending the write data from the write data path while outputting the read data from the read data path.

15. The method as recited in claim 8, wherein said sensing read data comprises sensing a voltage difference between complementary pairs of bit line values stored in the array, and wherein said sending write data comprises driving complementary pairs of bit line values onto the array.

* * * * *

(12) EX PARTE REEXAMINATION CERTIFICATE (9072nd)
United States Patent
Tran et al.

(10) Number: US 7,142,477 C1
(45) Certificate Issued: Jun. 12, 2012

(54) MEMORY INTERFACE SYSTEM AND METHOD FOR REDUCING CYCLE TIME OF SEQUENTIAL READ AND WRITE ACCESSES USING SEPARATE ADDRESS AND DATA BUSES

(75) Inventors: Thinh Tran, Palo Alto, CA (US); Joseph Tzou, Mountain View, CA (US); Suresh Parameswaran, Milpitas, CA (US)

(73) Assignee: Cypress Semiconductor Corp., San Jose, CA (US)

Reexamination Request:
No. 90/011,801, Jul. 18, 2011

Reexamination Certificate for:
Patent No.: 7,142,477
Issued: Nov. 28, 2006
Appl. No.: 10/871,825
Filed: Jun. 18, 2004

(51) Int. Cl.
*G11C 8/00* (2006.01)

(52) U.S. Cl. .............................. 365/230.02; 365/230.01; 365/230.08

(58) Field of Classification Search ........................ None
See application file for complete search history.

(56) References Cited

To view the complete listing of prior art documents cited during the proceeding for Reexamination Control Number 90/011,801, please refer to the USPTO's public Patent Application Information Retrieval (PAIR) system under the Display References tab.

*Primary Examiner* — Pia Tibbits

(57) ABSTRACT

A memory interface system and method are provided for transferring data between a memory controller and an array of storage elements. The storage elements are preferably SRAM elements, and the memory interface is preferably one having separate address bus paths and separate data bus paths. One address bus path is reserved for receiving read addresses and the other address bus path is reserved for receiving write addresses. One of the data bus paths is reserved for receiving read data from the array, and the other data bus path is reserved for receiving data written to the array. While bifurcating the address and data bus paths within the interface is transparent to the memory controller, the separate paths afford addressing phases of a read and write address operation to be partially overlapped, as well as the data transfer phases. This will essentially reduce the cycle time between a read and write memory access, and proves useful when maximizing the data throughput across the data bus when implementing double data rate (QDR) mechanisms.

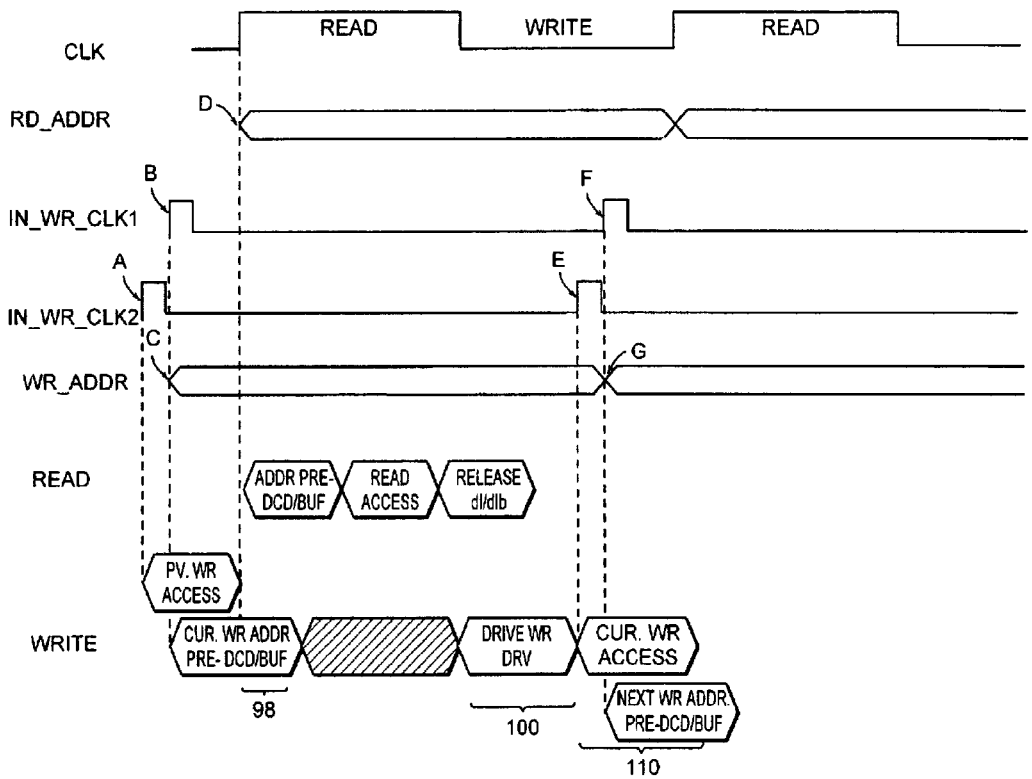

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 8-15 is confirmed.

Claim 1 is determined to be patentable as amended.

Claims 2-4 and 7, dependent on an amended claim, are determined to be patentable.

New claims 16-79 are added and determined to be patentable.

Claims 5 and 6 were not reexamined.

1. A memory interface system for addressing an array of storage elements, comprising:
    a first latch coupled to receive a read address and a write address;
    a first path and a second path coupled to an output of the latch for receiving respective said read address and said write address;
    a storage device coupled to the second path; and
    a multiplexer having a first input coupled to the first path and a second input coupled to the second path for sending the read address into the array before sending the write address stored by the storage device into the array; *and*
    *a sense amplifier coupled to the array for sensing read data from the array of storage elements sent across a read data path while write data is sent across a write data path to be written to the array at the write address, said read data accessed by the read address.*

16. *The method as recited in claim 8, comprising:*
    *receiving one read address on the read address path and one write address on the write address path during successive portions of a clock cycle.*

17. *The system as recited in claim 1, comprising:*
    *a first data path that includes the sense amplifier;*
    *a second data path that includes a storage device coupled to store write data sent to the array; and*
    *a common data path that outputs the sensed read data and inputs the write data to store in the storage device.*

18. *A method for accessing an array of storage elements, comprising:*
    *storing upon an input to a multiplexer a first write address sent over a write address path;*
    *sending upon another input to the multiplexer a first read address sent over a read address path in parallel with the write address path;*
    *sending read data from the array of storage elements sent across a read data path read data accessed by the first read address;*
    *while sensing read data by a sense amplifier, sending write data across a write data path to be written to the array at the first write address; and*
    *receiving one read address on the read address path and one write address on the write address path during successive portions of a clock cycle.*

19. *The method of claim 18, wherein the storing comprises holding the first write address held within a set of registers.*

20. *The method of claim 18, comprising:*
    *forwarding the first read address from the multiplexer before forwarding the first write address.*

21. *The method of claim 18, comprising:*
    *forwarding the first read address from the multiplexer while storing upon an input to the multiplexer the first write address.*

22. *The method of claim 18, wherein the sensing comprises storing the sensed read data in an output buffer while sending the write data across the write data path.*

23. *The method of claim 18, comprising:*
    *storing the write data into a set of registers coupled to the write data path while storing the sensed read data in an output buffer coupled to the read data path.*

24. *The method of claim 18, comprising:*
    *selecting complementary bit lines for sending the write data from the write data path while outputting the read data from the read data path.*

25. *The method of claim 18, wherein the sensing read data comprises sensing a voltage difference between complementary pairs of bit line values stored in the array, and*
    *wherein the sending write data comprises driving complementary pairs of bit line values onto the array.*

26. *A memory interface for addressing an array of storage elements, comprising:*
    *a first latch coupled to receive a read address and a write address;*
    *a first path and a second path coupled to an output of the latch for receiving respectively the read address and the write address based on a first clock signal;*
    *a storage device coupled to the second path, the storage device sampling values on the output of the latch based on a first internal clock signal;*
    *a multiplexer having a first input coupled to the first path and a second input coupled to the second path for sending the read address into the array before sending the write address stored by the storage device into the array, the multiplexer receiving a decoded write address based on a second internal clock signal; and*
    *a sense amplifier coupled to the array for sensing read data from the array of storage elements sent across a read data path while write data is sent across a write data path to be written to the array at the write address, the read data accessed by the read address.*

27. *The system of claim 26, wherein the first and second paths receive respectively one read address and one write address during successive portions of a clock cycle.*

28. *The system of claim 26, wherein the array of storage elements are coupled to a plurality of word line driver inputs.*

29. *The system of claim 28, wherein the multiplexer comprises a plurality of output conductors coupled to the plurality of word line driver inputs for receiving the read address before receiving the write address.*

30. *The system of claim 26, wherein the first and second paths each comprise a pre-decoder and a buffer.*

31. The system of claim 30, wherein the write address is sent through the pre-decoder and the buffer upon the second path from the storage device and held within a second latch whose output is coupled to the second input upon the first input receiving the read address.

32. The system of claim 26, wherein the first input and the second input are coupled to receive the write address before a read enable signal is received upon a select pin of the multiplexer.

33. The system of claim 26, wherein the storage device comprises a set of registers.

34. The system of claim 26, comprising:
a first data path that includes the sense amplifier;
a second data path that includes a storage device coupled to store the write data; and
a common data path that outputs the sensed read data and inputs the write data to store in the storage device.

35. A method for accessing an array of storage elements, comprising:
storing upon an input to a multiplexer a write address sent over a write address path, the storing based on a first internal clock signal;
sending upon another input to the multiplexer a read address sent over a read address path in parallel with the write address path, the sending based on a first clock signal;
sensing read data from the array of storage elements sent across a read data path read data accessed by the read address;
while sensing read data, sending write data across a write data path to be written to the array at the write address; and
initiating a write access for the write address based on a second internal clock signal.

36. The method of claim 35, comprising:
receiving one read address on the read address path and one write address on the write address path during successive portions of a clock cycle.

37. The method of claim 35, wherein the storing comprises holding the write address held within a set of registers.

38. The method of claim 35, comprising:
forwarding the read address from the multiplexer before forwarding the write address.

39. The method of claim 35, comprising:
forwarding the read address from the multiplexer while storing upon an input to the multiplexer the write address.

40. The method of claim 35, wherein the sensing comprises storing the sensed read data in an output buffer while sending the write data across the write data path.

41. The method of claim 35, comprising:
storing the write data into a set of registers coupled to the write data path while storing the sensed read data in an output buffer coupled to the read data path.

42. The method of claim 35, comprising:
selecting complementary bit lines for sending the write data from the write data path while outputting the read data from the read data path.

43. The method of claim 35, wherein the sensing read data comprises sensing a voltage difference between complementary pairs of bit line values stored in the array, and
wherein the sending write data comprises driving complementary pairs of bit line values onto the array.

44. A memory interface system for addressing an array of storage elements, comprising:

a first latch coupled to receive a read address and a write address;
a first path and a second path coupled to an output of the latch for receiving and decoding respectively the read address and the write address,
wherein the read address traverses the first path while the write address traverses the second path;
a storage device coupled to the second path;
a multiplexer having a first input coupled to the first path and a second input coupled to the second path for sending the read address into the array before sending the write address stored by the storage device into the array; and
a sense amplifier coupled to the array for sensing read data form the array of storage elements sent across a read data path while write data is sent across a write data path to be written to the array at the write address, the read data accessed by the read address.

45. The system of claim 44, wherein the first and second paths receive respectively one read address and one write address during successive portions of a clock cycle.

46. The system of claim 44, wherein the array of storage elements are coupled to a plurality of word line driver inputs.

47. The system of claim 46, wherein the multiplexer comprises a plurality of output conductors coupled to the plurality of word line driver inputs for receiving the read address before receiving the write address.

48. The system of claim 44, wherein the first and second paths each comprise a pre-decoder and a buffer.

49. The system of claim 48, wherein the write address is sent through the pre-decoder and the buffer upon the second path from the storage device and held within a second latch whose output is coupled to the second input upon the first input receiving the read address.

50. The system of claim 44, wherein the first input and the second input are coupled to receive the write address before a read enable signal is received upon a select pin of the multiplexer.

51. The system of claim 44, wherein the storage device comprises a set of registers.

52. The system of claim 44, comprising:
a first data path that includes the sense amplifier;
a second data path that includes a storage device coupled to store the write data; and
a common data path that outputs the sensed read data and inputs the write data to store in the storage device.

53. A method for accessing an array of storage elements, comprising:
storing upon a first input path to a multiplexer a write address sent over a write address path;
sending the write address to traverse the first input path to the multiplexer,
wherein the write address is decoded along the first input path;
sending upon a second input path to the multiplexer a read address sent over a read address path in parallel with the write address path;
while the write address traverses the first input path to the multiplexer, sending the read address to traverse the second input path to the multiplexer,
wherein the read address is decoded along the second input path;
sensing read data from the array of storage elements sent across a read data path read data accessed by the read address; and while sensing read data, sending write data across a write
data path to be written to the array at the write address.

54. The method of claim 53, comprising:
receiving one read address on the read address path and one write address on the write address path during successive portions of a clock cycle.

55. The method of claim 53, wherein the storing comprises holding the write address held within a set of registers.

56. The method of claim 53, comprising:
forwarding the read address from the multiplexer before forwarding the write address.

57. The method of claim 53, comprising:
forwarding the read address from the multiplexer while storing upon an input to the multiplexer the write address.

58. The method of claim 53, wherein the sensing comprises storing the sensed read data in an output buffer while sending the write data across the write data path.

59. The method of claim 53, comprising:
storing the write data into a set of registers coupled to the write data path while storing the sensed read data in an output buffer coupled to the read data path.

60. The method of claim 53, comprising:
selecting complementary bit lines for sending the write data from the write data path while outputting the read data from the read data path.

61. The method of claim 53, wherein the sensing read data comprises sensing a voltage difference between complementary pairs of bit line values stored in the array, and
wherein the sending write data comprises driving complementary pairs of bit line values onto the array.

62. A memory interface system for addressing an array of storage elements, comprising:
a first latch coupled to receive a read address and a first write address;
a first path and a second path coupled to an output of the latch for receiving respectively the read address and the first write address;
a storage device coupled to the second path;
a multiplexer having a first input coupled to the first path and a second input coupled to the second path for sending the read address into the array before sending the first write address stored by the storage device into the array; and
a sense amplifier coupled to the array for sensing read data from the array of storage elements sent across a read data path while the write data is sent acrosss a write data path to be written to the array at the first write address, the read data accessed by the read address; and
wherein a second write address is sent over the second path while a write access is performed on the array for the write data at the first write address.

63. The system of claim 62, wherein the first and second paths receive respectively one read address and one write address during successive portions of a clock cycle.

64. The system of claim 62, wherein the array of storage elements are coupled to a plurality of word line driver inputs.

65. The system of claim 64, wherein the multiplexer comprises a plurality of output conductors coupled to the plurality of word line driver inputs for receiving the read address before receiving the first write address.

66. The system of claim 62, wherein the first and second paths each comprise a pre-decoder and a buffer.

67. The system of claim 66, wherein the first write address is sent through the pre-decoder and the buffer upon the second path from the storage device and held within a second latch whose output is coupled to the second input upon the first input receiving the read address.

68. The system of claim 62, wherein the first input and the second input are coupled to receive the first write address before a read enable signal is received upon a select pin of the multiplexer.

69. The system of claim 62, wherein the storage device comprises a set of registers.

70. The system of claim 62, comprising:
a first data path that includes the sense amplifier;
a second data path that includes a storage device coupled to store the write data; and
a common data path that outputs the sensed read data and inputs the write data to store in the storage device.

71. A method for accessing an array of storage elements, comprising:
storing upon an input to a multiplexer a first write address sent over a write address path;
sending upon another input to the multiplexer a read address sent over a read address path in parallel with the write address path;
sensing read data from the array of storage elements sent across a read data path read data accessed by the read address;
while sensing read data, sending write data across a write data path to be written to the array at the first write address; and
while performing a write access on the array for the write data, sending a second write address over the write address path.

72. The method of claim 71, comprising:
receiving one read address on the read address path and one write address on the write address path during successive portions of a clock cycle.

73. The method of claim 71, wherein the storing comprises holding the first write address held within a set of registers.

74. The method of claim 71, comprising:
forwarding the read address from the multiplexer before forwarding the first write address.

75. The method of claim71, comprising:
forwarding the read address from the multiplexer while storing upon an input to the multiplexer the first write address.

76. The method of claim 71, wherein the sensing comprises storing the sensed read data in an output buffer while sending the write data across the write data path.

77. The method of claim 71, comprising:
storing the write data into a set of registers coupled to the write data path while storing the sensed read data in an output buffer coupled to the read data path.

78. The method of claim 71, comprising:
selecting complementary bit lines for sending the write data from the write data path while outputting the read data from the read data path.

79. The method of claim 71, wherein the sensing read data comprises sensing a voltage difference between complementary pairs of bit line values stored in the array, and
wherein the sending write data comprises driving complementary pairs of bit line values onto the array.

* * * * *